US007534975B1

(12) United States Patent
Sharrah et al.

(10) Patent No.: US 7,534,975 B1
(45) Date of Patent: May 19, 2009

(54) FLASHLIGHT AND LIGHT SOURCE SELECTOR

(75) Inventors: Raymond L. Sharrah, Collegeville, PA (US); Albert K. Kehl, Jr., Gilbertsville, PA (US)

(73) Assignee: Streamlight, Inc., Eagleville, PA (US)

( * ) Notice: Subject to any disclaimer, the term of this patent is extended or adjusted under 35 U.S.C. 154(b) by 313 days.

(21) Appl. No.: 11/699,947

(22) Filed: Jan. 30, 2007

Related U.S. Application Data

(60) Provisional application No. 60/764,679, filed on Feb. 2, 2006.

(51) Int. Cl.
*H03K 17/975* (2006.01)

(52) U.S. Cl. ....................................... 200/600; 200/336

(58) Field of Classification Search ................. 200/600, 200/336; 362/184, 185, 205, 16, 800
See application file for complete search history.

(56) References Cited

U.S. PATENT DOCUMENTS

| | | | | |
|---|---|---|---|---|
| 2,503,287 | A * | 4/1950 | Moore | 200/60 |
| 4,346,329 | A | 8/1982 | Schmidt | |
| 5,161,095 | A * | 11/1992 | Gammache | 362/197 |
| 5,359,779 | A * | 11/1994 | Polk et al. | 42/115 |
| 5,412,548 | A * | 5/1995 | Yee | 362/202 |
| 5,418,433 | A | 5/1995 | Nilssen | |
| 5,629,105 | A * | 5/1997 | Matthews | 429/97 |
| 5,871,272 | A * | 2/1999 | Sharrah et al. | 362/184 |
| 6,012,824 | A * | 1/2000 | Sharrah et al. | 362/199 |
| 6,024,471 | A * | 2/2000 | McDermott | 362/394 |
| 6,046,572 | A * | 4/2000 | Matthews et al. | 320/116 |
| 6,140,776 | A | 10/2000 | Rachwal | |
| 6,222,138 | B1 * | 4/2001 | Matthews et al. | 200/4 |
| 6,239,555 | B1 | 5/2001 | Rachwal | |
| 6,249,089 | B1 | 6/2001 | Bruwer | |
| 6,250,771 | B1 * | 6/2001 | Sharrah et al. | 362/184 |
| 6,296,367 | B1 * | 10/2001 | Parsons et al. | 362/183 |
| 6,307,328 | B1 | 10/2001 | Ko et al. | |
| 6,345,464 | B1 * | 2/2002 | Kim et al. | 42/114 |
| 6,388,390 | B2 | 5/2002 | Rachwal | |
| 6,523,972 | B2 * | 2/2003 | Sharrah et al. | 362/184 |
| 6,621,225 | B2 | 9/2003 | Bruwer | |
| 6,626,556 | B2 * | 9/2003 | Galli | 362/205 |

(Continued)

OTHER PUBLICATIONS

SureFire U2 Ultra LED Flashlight (including larger image), © 2001-2005, http://www.surefire.com/maxexp/main/co_disp/displ/prrfnbr/24187/sesent/00, Printed Dec. 1, 2005, 3 pages.

(Continued)

*Primary Examiner*—Michael A Friedhofer
*Assistant Examiner*—Lisa N Klaus
(74) *Attorney, Agent, or Firm*—Clement A. Berard, Esq.; Dann, Dorfman, Herrell & Skillman, PC

(57) ABSTRACT

A selector arrangement comprises a support member including a spring member adjacent an opening therein, and a rotary electrical switch supported within the support member and having plural rotational selection positions. The rotary electrical switch is actuatable about a radial extending through the opening of the support member by a rotatable selector knob in the opening of the support member. The selector knob and the spring member may cooperate to provide a detent, or to retain the selector knob in the support member, or both.

57 Claims, 4 Drawing Sheets

U.S. PATENT DOCUMENTS

| | | | | |
|---|---|---|---|---|
| 6,650,066 | B2 | 11/2003 | Bruwer | |
| 6,659,621 | B2 * | 12/2003 | Sharrah et al. | 362/183 |
| 6,841,941 | B2 | 1/2005 | Kim et al. | |
| 6,893,143 | B2 * | 5/2005 | Opolka | 362/241 |
| 6,952,084 | B2 | 10/2005 | Bruwer | |
| 6,984,900 | B1 | 1/2006 | Bruwer | |
| 7,186,000 | B2 * | 3/2007 | Lebens et al. | 362/184 |
| RE40,027 | E * | 1/2008 | Matthews | 429/97 |
| 7,344,270 | B2 | 3/2008 | Kim | |
| 7,393,119 | B2 * | 7/2008 | Lebens et al. | 362/205 |
| 7,393,120 | B2 * | 7/2008 | Kang et al. | 362/205 |
| 7,422,344 | B2 * | 9/2008 | Wu et al. | 362/184 |
| 7,441,920 | B2 * | 10/2008 | Kang et al. | 362/205 |
| 2002/0021573 | A1 | 2/2002 | Zhang | |
| 2002/0097576 | A1 | 7/2002 | Sharrah et al. | |
| 2004/0217655 | A1 | 11/2004 | Bruwer | |
| 2004/0227409 | A1 | 11/2004 | Bruwer | |
| 2005/0077837 | A1 | 4/2005 | Kim et al. | |
| 2005/0083626 | A1 | 4/2005 | Bruwer | |
| 2005/0121980 | A1 | 6/2005 | Bruwer | |
| 2005/0122710 | A1 | 6/2005 | Kim | |
| 2005/0122712 | A1 | 6/2005 | Kim | |
| 2005/0122714 | A1 | 6/2005 | Matthews et al. | |
| 2005/0128741 | A1 | 6/2005 | Matthews et al. | |
| 2005/0140310 | A1 | 6/2005 | Bruwer | |
| 2005/0237737 | A1 | 10/2005 | Kim | |

OTHER PUBLICATIONS

LED Lights Comparison Chart, http://www.surefire.com/surefire/content/comparechart_LED.html, Printed Dec. 5, 2005, 1 page.

Flashlight Reviews and LED Modifications, FlashlightReviews.com, “In2theLight Trio, 29 LED Flashlight”, 7 pages (prior to filing date).

* cited by examiner

FLASHLIGHT AND LIGHT SOURCE SELECTOR

This application claims the benefit of U.S. Provisional Patent Application No. 60/764,679 Filed Feb. 2, 2006.

The present invention relates to a flashlight light source selector.

In certain different locations and environments a user of a flashlight may desire light of different intensity or brightness, or of different colors, or both, and it is inconvenient to have to carry several flashlights in order to have available light of the particular color and/or intensity desired. For example, hunters often prefer green light and military personnel often prefer red light. In addition, brighter or lower intensity light may be desired under different ambient lighting conditions, e.g., to preserve night vision.

One known flashlight provides selectable brightness levels in response to rotation of a selector ring that is located forward on the flashlight body immediately behind the light producing head. Such arrangement is disadvantageous because it generally requires two hands to change the intensity—one hand to hold the flashlight and the other to grasp and rotate the ring.

Other known flashlights all user selection of incandescent (lamp) and solid state (LED) light sources, some with plural light sources of one type or the other. These flashlights generally have push-type switches that disadvantageously require the user to sequence through some or all of the possible states of the light in a fixed uni-directional sequence of selections in order to reach the desired selection.

Accordingly, there is a need for a flashlight and selector that facilitates selection of light source and/or light intensity and/or light color. It would also be desirable if such selector were operable with one hand, e.g., the hand holding the flashlight. A selector providing visual or tactile confirmation, or both, would also be desirable.

A light source selector may comprise a support member including a spring member adjacent an opening therein, and a rotary electrical switch supported within the support member and having plural rotational selection positions. The rotary electrical switch is actuatable about a radial extending through the opening of the support member by a rotatable selector knob in the opening of the support member. The selector knob and the spring member may cooperate to provide a detent, or to retain the selector knob in the support member, or both.

BRIEF DESCRIPTION OF THE DRAWING

The detailed description of the preferred embodiment(s) will be more easily and better understood when read in conjunction with the FIGURES of the Drawing which include.

Figure 1:
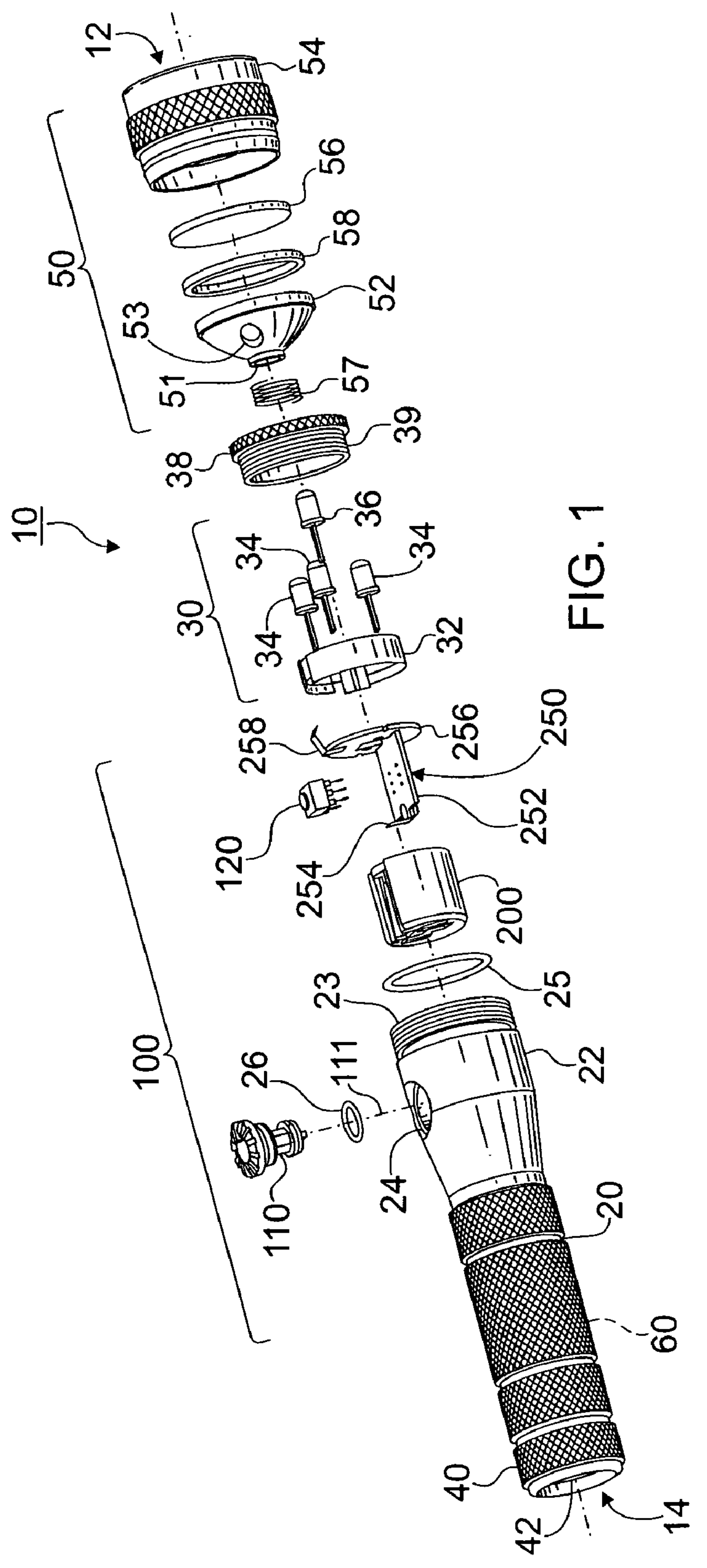
FIG. 1 is an exploded isometric view of an example embodiment of a flashlight including a selector arrangement.

In the Drawing, where an element or feature is shown in more than one drawing figure, the same alphanumeric designation may be used to designate such element or feature in each figure, and where a closely related or modified element is shown in a figure, the same alphanumerical designation primed or the like may be used to designate the modified element or feature. Similarly, similar elements or features may be designated by like alphanumeric designations in different figures of the Drawing and with similar nomenclature in the specification. It is noted that, according to common practice, the various features of the drawing are not to scale, and the dimensions of the various features are arbitrarily expanded or reduced for clarity, and any value stated in any Figure is given by way of example only.

DESCRIPTION OF THE PREFERRED EMBODIMENT(S)

Figure 2:
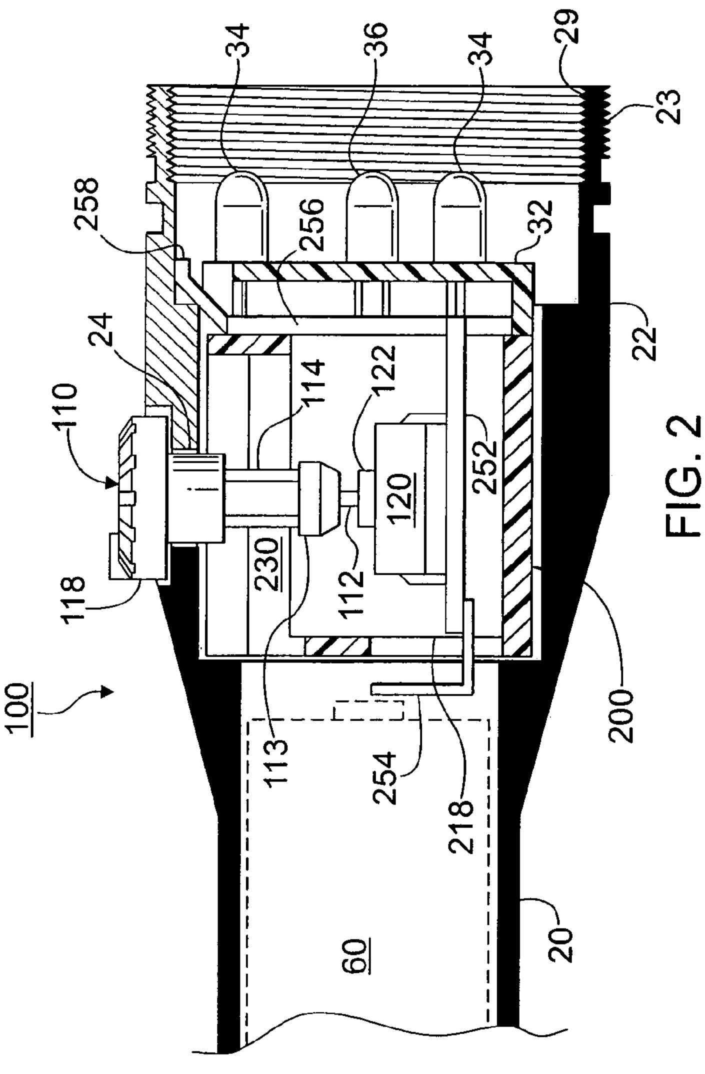
FIG. 2 is a cross-sectional view of an example embodiment of the example flashlight including a selector arrangement as in FIG. 1.

The present arrangement is described generally in relation to FIG. 1 which is an exploded isometric view, and FIG. 2 which is a cross-sectional view, of an example embodiment of a flashlight 10 including a selector arrangement 100. Flashlight 10 includes a housing 20 having a light source 30 at a head end 12 thereof and optionally may have an ON/OFF switch 42, e.g., a pushbutton switch 42 at a tail end 14 or other location thereof. Housing 20 typically contains one or more batteries 60 that provide electrical energy for selectively energizing light source 30 in response to operation of an ON/OFF switch, e.g., ON/OFF switch 42. Switch 42 may be disposed in a rotatable tail cap 40 that is threadable onto the tail end 14 of housing 20 for providing momentary and continuous ON operation or may be a clicker-type switch disposed in tail cap 40, or at another desired location.

For various reasons it may be desirable that light source 30 include more than one source of light and that each source of light may be individually operable, and/or that light source 30 be operable at plural different light producing conditions (e.g., at different light intensity or brightness levels and/or with light of different colors or wavelengths being produced), and/or that different types of light sources (e.g., incandescent and light-emitting diode (LED) light sources) be utilized, and/or that light source 30 be or remain OFF (e.g., irrespective of operation of switch 42 or in place of switch 42), and/or any combination of any of the foregoing. Selector arrangement 100 provides desired ones of the foregoing selections responsive to the rotational position of selector knob 110.

Selector knob 110 is preferably located on housing 20 through opening 24 in a wall of housing 20 relatively nearer to the head end 12 of light 10, so as to be conveniently operable by a user. Preferably, selector knob 110 is located so as to be conveniently operable by the thumb or other finger of the hand holding flashlight 10. Nevertheless, selector knob 110 may be located at another location on housing 20 as may be desired.

Selector knob 110 extends into the interior of housing 20 and is rotatable about axis 111 for operating rotary electrical switch 120 which has a plurality of positions producing different combinations of open and closed electrical contacts for connecting light source 30 and battery 60 in circuit in different ways to produce the desired different operating conditions. Thus, the number of positions (operating conditions) of rotary switch 120 corresponds to the number of desired operating conditions for light source 30, and rotary switch 120 typically has a detent at each position to help maintain that position as well as to provide tactile feedback to a user that the switch has reached an operating position. Selector rotary electrical switch 120 is supported in housing 20 by a support member 200, e.g., by an electrical printed circuit wiring board 250 therein.

Thus, if two different operating conditions were to be desired, then rotary switch 120 typically would have two operating positions located at about 180° of rotation apart. If three different operating conditions were to be desired, then rotary switch 120 typically would have three operating positions located at about 120° of rotation apart. If four different operating conditions were to be desired, then rotary switch 120 typically would have four operating positions located at about 90° of rotation apart. While any reasonable number of positions N could be provided, with rotary switch 120 having a detent at about every 360°/N, more than about 6-8 positions are probably not practical for relatively small size selector knobs, e.g., knobs of about 1 cm (about 0.4 inch) diameter as might be employed on a typical flashlight, e.g., a flashlight of about 2-5 cm (about 0.8-2 inches) diameter.

Consider an example wherein light source 30 has two different light sources, e.g., light sources 34 and 36, and it is desired to have four different operating conditions: (1) light source 360N, (2) light source 34 high brightness, (3) light source 34 low brightness, and (4) both light sources 34 and 36 off. For this arrangement, selector knob 110 would have four stable, preferably detented, positions located at about 90° of rotation apart corresponding to the four conditions (1)-(4).

With selector switch 120 in position (1), light source 36 is connected in circuit with battery 60 to produce light at a desired brightness, e.g., at a relatively high brightness. If light source 36 is an incandescent lamp, then light source 36 and battery 60 may be directly connected in position (1) with the full voltage of battery 60 applied to lamp 36. With selector switch 120 in position (2), light source 34 is connected in circuit with battery 60 to produce light at a relatively higher brightness than in position (3). With selector switch 120 in position (3), light source 34 is connected in circuit with battery 60 to produce light at a relatively lower brightness than in position (2). If light source 34 is a solid state light source, such as an LED, then the LED light source and battery 60 may be connected via a relatively lower value resistor (or other voltage reducing component or circuit) in position (2) and may be connected via a relatively higher value resistor (or other voltage reducing component or circuit) in position (3). With selector switch 120 in the OFF position (4), neither light source 34 nor light source 36 is connected in circuit with battery 60, and so neither produces light.

In the foregoing example, if light source 36 were to comprise an incandescent lamp, e.g., a xenon lamp, and light source 34 were to comprise plural white LEDs, then selector arrangement 100 would enable flashlight 10 to produce white (incandescent) light, relatively higher intensity white LED light, relatively lower intensity white LED light, or no light, in accordance with the position to which selector arrangement 100 is set, e.g., when tail cap switch 24, if present, is in an ON position. For example, relatively higher intensity white LED light could be produced by energizing plural ones of LEDs 34 and relatively lower intensity white LED light could be produced by energizing one of LEDs 34.

In another example, if light source 36 were to comprise a white LED and light source 34 were to comprise a red LED, then selector arrangement 100 could enable flashlight 10 to produce bright white LED light, lower intensity white LED light, red light, or no light, in accordance with the position to which selector arrangement 100 is set.

In another example, light source 34 might comprise one or more red LEDs and light source 36 might comprise one or more green LEDs, thereby to provide selectable red and green or other colors or wavelengths of light, and optionally, selectable intensity levels of light, in accordance with the position to which selector arrangement 100 is set.

In yet another example, the four different operating conditions might comprise: (1) light source 36 high brightness, (2) light source 36 low brightness, (3) light source 34 on, and (4) both light sources 34 and 36 off.

One advantage of the described arrangement is that one flashlight can provide light of different colors, different wavelengths, different intensities, or any combination thereof, so that a user need only carry one light rather than carrying several lights. Such a flashlight is thought to be particularly useful for hunters who prefer green light at certain times and white light at other times, and for military personnel, e.g., pilots, who prefer red light at certain times and white light at other times. In addition, blue or ultraviolet (UV) LED's could be provided, e.g., for use by service and/or hazardous material personnel, for detecting certain fluids and other substances.

Selector knob 110 may be retained in housing 20 of flashlight 10 by spring members 230 of support member 200 that engage a circumferential groove 114 or projections 113 of selector knob 110 and that also engage flat sections in groove 114 for providing a detent. Specifically, spring members 230 of support member 200 cooperate with flat surfaces of groove 114 of selector knob 110 to provide detents corresponding to the operation positions of rotary switch 120. Specifically, groove 114 of selector knob 110 may have a number of flats and raised cams alternatingly arranged around a periphery of selector knob 110. Typically, the periphery is radially displaced from axis 111, and the cams may be provided at the edge line defined by the intersection of adjacent flats. The detents provided by selector knob 110 and spring members 230 are in addition to the detents (if any) of rotary switch 120 itself, and preferably are "stronger," i.e. are more resistant to rotation than are those of rotary switch 120, thereby to provide a more definite tactile feedback to a user that the selector has reached an operating position, e.g., a stable position in the rotation of selector knob 110.

Preferably, and optionally, knob portion 118 may include several radial grooves 118G that improve gripping by a user's finger. Also preferably, and optionally, knob portion 118 may include a projection 118P that provides a tactile feature to indicate the rotary position of knob 110 to a user by sense of touch, as well as to provide a gripping feature.

Selector knob 110 also may include an optional circumferential groove 116 into which an O-ring 26 may be placed for sealing opening 24 in housing 20 into which or through which a user control knob portion 118 of selector knob 110 extends.

Rotary switch 120 mounts on circuit board 252 of circuit board structure 250 with its rotary actuator 122 accessible from a direction generally perpendicular to circuit board 252, e.g., a generally radial direction, and engaging feature 112 of selector knob 110 engages rotary actuator 122 of rotary switch 120 in a generally perpendicular manner. Selector knob 110 is rotatable about an axis 111 that is generally perpendicular to circuit board 252 for actuating the rotary actuator 122 of rotary switch 120. If actuator 122 of rotary switch 120 includes a recess, then selector knob 110 has a complementary projection 112 that engages the recess of actuator 122; if actuator 122 of rotary switch 120 includes a projection, then selector knob 110 may have a complementary recess with which the projection of actuator 122 engages.

Circuit board structure 250 comprises circuit boards 252 and 256 that may be angled with respect to each other, and may be substantially perpendicular to each other as illustrated. Circuit board 252 is disposed substantially parallel to a longitudinal axis of housing 20 within support member 200, wherein rotary switch 120 on circuit board 252 is properly positioned to engage selector knob 110, e.g., at engaging features 112, 122. Contact 254 extends rearward towards end 14 from circuit board 252 for making electrical connection to a source of electrical power, e.g., through opening 218 of support member 200 to contact a terminal of battery 60 in housing 20.

Circuit board 256 is disposed substantially transversely in housing 20 adjacent to support member 200 and circuit board 252. Electrical connections between circuit boards 252 and 256 may be by any convenient means, e.g., by extensions of circuit board 252 that extend into openings in circuit board 256 whereat they may be soldered, or by wires or other means. Contact 258 extends from circuit board 256 for making electrical connection to a source of electrical power, e.g., generally radially to make contact with the interior surface of light end 22 of housing 20. Lamp holder 32 and the leads of LEDs 34 typically connect to circuit board 256, e.g., by soldering thereto.

In the example embodiment illustrated, the electrical path from battery 60 is via contact 254 to circuit board 252 and through switch 120, circuit board 256 and lamp holder 32 to light source 30. A return path is provided via lamp holder 32, circuit board 256 and contact 258, and through the conductive housing 20 to another terminal of battery 60.

As a result, circuit boards 252 and 256 of circuit board structure 250 have lamp holder 32 mounted thereto and slip into support member 200 which slips into light end 22 of housing 20, thereby facilitating the assembly of light sources 30 with housing 20. The combination of light sources 30, circuit board structure 250 and support structure 200 are retained in the light end 22 of housing 20, e.g., by retainer ring 38. Retainer ring 38 may have external threads 39 that engage internal threads 20 of housing 20. Optionally, an O-ring 25 may be provided between threaded retainer ring 38 and light end 22 for tending to resist the passage of moisture and/or other substances through threads 29, 39, and/or may also tend to provide cushioning.

Light source 30 may comprise an incandescent lamp 36, e.g., a xenon incandescent lamp 36, and one or more, e.g., three, LEDs 34 that mount to circuit board 256 of circuit board structure 250. Lamp 36, typically a bi-pin lamp, preferably plugs into a receptacle on lamp holder 32 which is disposed adjacent to circuit board 256, whereby lamp 36 may easily be removed and replaced, if necessary. The leads of LEDs 34 are typically soldered to circuit board 256, but may also be connected with plug-in receptacles in lamp holder 32, if desired. Where plural LEDs 34 are provided, selection of brightness levels by selector 100 may comprise selecting the ones and/or the number of the plural LEDs 34 that are energized.

Reflector assembly 50 comprises a shaped reflector 52 in which the light producing elements 34, 36 of light source 30 are positioned for providing light emanating from the forward end 12 of light 10 in a beam of light of a desired form and shape. Reflector 52 has a relatively centrally located opening 51 through which xenon lamp 36 extends when reflector 52 is positioned adjacent to lamp holder 32. Reflector 52 also has a number of relatively peripherally located openings 53 through which LEDs 34 extend when reflector 52 is positioned adjacent to lamp holder 32. With three LEDs 34, three openings 53 are provided, typically about 120° apart.

Reflector 52 is positioned in lens cap 54, sometimes referred to as a face cap 54, which has a shoulder against which lens 56 and optional O-ring 58 bear under the urging or bias of spring 57 which is transmitted via reflector 52. Reflector spring 57 is compressed between lamp holder 32 and reflector 52 when lens cap 54 is threaded onto housing 20, thereby to urge or bias reflector 52, lens 56 and optional O-ring 58 in the forward direction towards end 12 into lens cap 54. Thus, the axial position of reflector 52 relative to lens cap 54 tends to be relatively fixed, however, lens cap 38 may be rotated relative to reflector 52. Specifically, internal threads of lens cap 54 engage external threads 23 of light end 22 of housing 20. Spring 57 also urges or biases lamp holder 32 rearward toward tail end 14.

Reflector 52 and lens cap 54 are free to move axially with respect to lamp holder 32 and housing 20 when lens cap 54 is rotated with respect to housing 20. As a result, the axial positions of lamp 36 and LEDs 34 with respect to reflector 52 may be changed by rotating lens cap 54 with respect to housing 20, thereby to adjust the focusing of the beam of light produced by light sources 34, 36 and shaped by reflector 53. O-ring 58 between reflector 52 and lens 56 trends to resist the passage of moisture and/or other substances through threads 23, and/or may also tend to provide cushioning.

Thus, the elements of selector arrangement 100, support 200, circuit board structure 250, light source 30 and/or reflector arrangement 50 cooperate to facilitate their assembly into the light end 22 of housing 20 of light 10 in a consistent and convenient manner, and in a way that tends to facilitate switch 120 on circuit board 252 being properly positioned so that engaging feature 112 of selector knob 110 and the actuator 122 of rotary switch 120 engage when selector knob 110 is inserted through opening 24 of housing 20.

As a result, light 10 may conveniently provide in a single portable light selectable light sources, selectable brightness levels, selectable colors and/or adjustable focusing of the light beam, i.e. features that may be found desirable by a user. In addition, where selector 100 includes an OFF position, selector 100 and switch 42 cooperate to provide a condition wherein neither selector 100 nor switch 42 alone can actuate to energize light source 30, thereby precluding accidental or inadvertent illumination of light 10.

Figure 4:
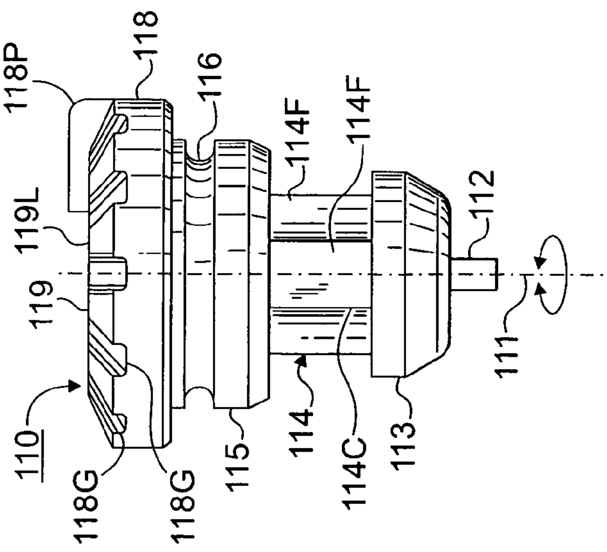
FIG. 4 is a view of an example selector knob suitable for use with the example selector arrangement as in FIGS. 1-3.
Figure 3B:
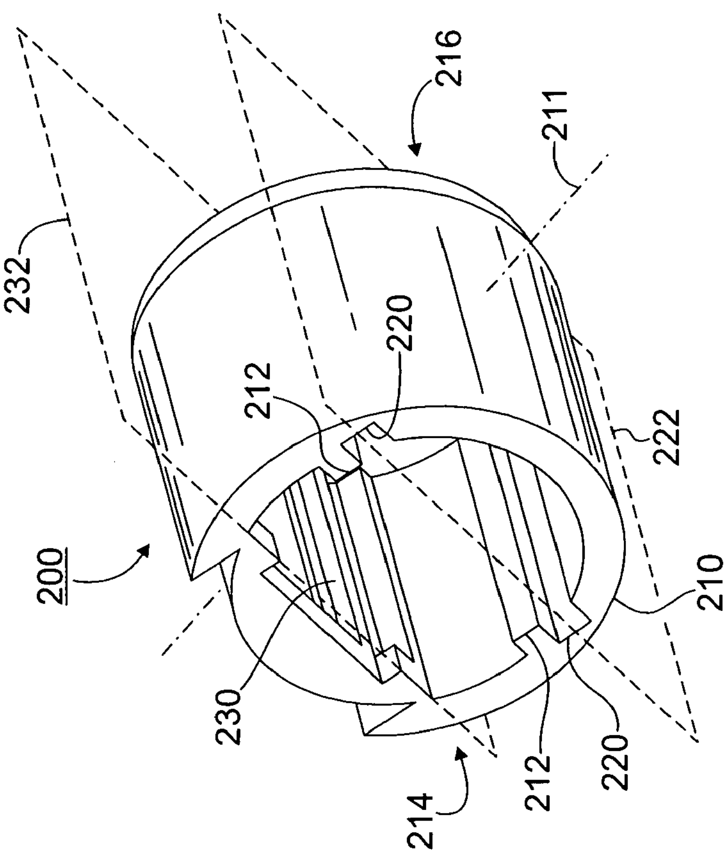
FIGS. 3A and 3B are first and second isometric views of an example embodiment of a support member suitable for use in the example flashlight including a selector arrangement as in FIGS. 1-2.
Figure 3A:
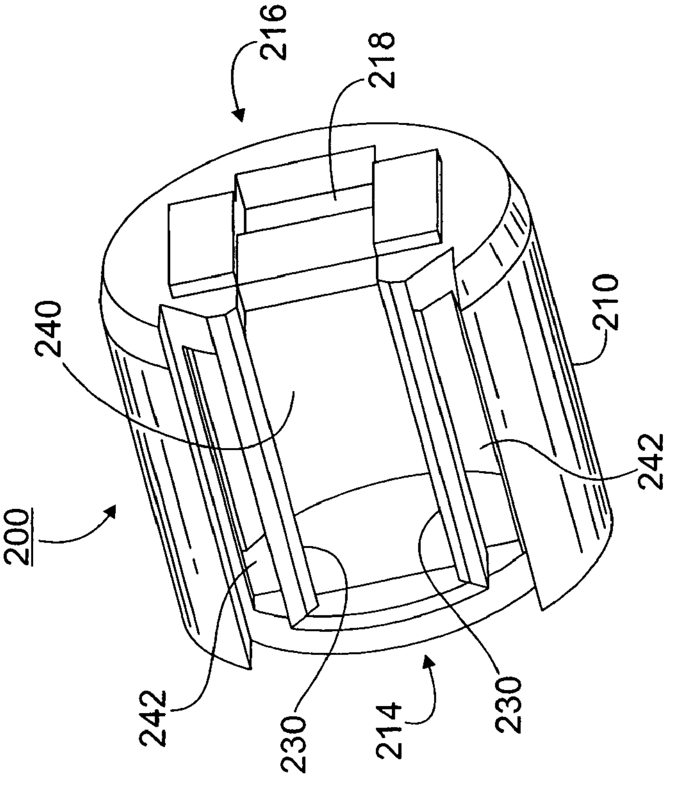

FIGS. 3A and 3B are first and second isometric views of an example embodiment of a support member 200, and FIG. 4 is a view of a selector knob 110, suitable for use in the example flashlight 10 including a selector arrangement 100 as in FIGS. 1-2. Support member 200 and selector knob 110 cooperate for providing a selection function, and optionally for providing a detent, for selector 100.

Support member 200 has a generally cylindrical outer support 210 having an outer diameter that is selected to be slightly smaller than the inner diameter of housing 20 of flashlight 10 so that support member 200 can slip into the interior of housing 20. Support member 200 has an axial length that is convenient relative to the axial length of printed circuit board structure 250.

Support member 200 has a pair of opposing grooves or slots 220 on the interior surface of outer cylindrical support 210 into which electronic printed wiring circuit wiring board 252 of circuit board structure 250 fits. Opposing grooves 220 are in the same chordal plane 222 so as to easily receive a planar circuit board 252. Chords at the same radial distance and radial angle with respect to the central axis of cylindrical support member 200 define a chordal plane, e.g., chordal planes 222, 232, and each chordal plane 222, 232 is perpendicular to a radial line 211 at that radial angle. With rotary switch 120 mounted on circuit board 252 of circuit board structure 250, its actuator 122 is accessible from a direction generally perpendicular to circuit board 252, e.g., through an opening 240 of support member 200. Grooves 220 may be defined by recesses in the inner surface of outer support 210, or by raised ribs, ridges or other raised features 212 on outer support 210, or by a combination of the foregoing, as illustrated.

One end 214 of support member 200 may be generally open, e.g., so as to facilitate circuit board 252 being slipped into grooves 220 of cylindrical outer support 210, and the other end 216 thereof may be at least partially closed so that circuit board 252 may abut or at least be close to the partially closed end 216, e.g., so as to provide a positive stop for circuit board structure 250. Partially closed end 216 may have one or more openings therein, e.g., an opening 218 through which connections may more easily be made to the end of circuit board 252 that is close to end 216, such as by a wire or a spade terminal, e.g., such as contact 254 for contacting a terminal of battery 60.

Opening 240 of cylindrical support member 200 is defined by two substantially parallel spaced apart spring members 230 disposed substantially in a plane 232, preferably a chordal plane 232 parallel to the plane 222 defined by circuit board 252 when it is disposed in grooves 220. Opposing springs 230 are preferably in the form of longitudinal or axial bars or rods 230, e.g., elongated members 230, that are supported at their respective ends by support member 200. Thus, spring members 230 are free to flex in the chordal plane 232 in which they lie, i.e. towards and away from the radial line 211 which is perpendicular to the chordal plane 232 in which spring members 230 lie. Preferably, radial line 211 substantially coincides with or is substantially parallel to the axis 111 of selector knob 110, e.g., the axis 111 about which selector knob 110 is rotatable, when selector knob 110 is positioned within support member 200 engaging rotary actuator 120 on circuit board 252.

Spring members 230 typically are spaced apart substantially the same distance as the dimension between 180° opposing flats of groove 114 of selector knob 110, or a slightly smaller distance. When selector knob 110 is rotated, rotation tends to be resisted when the opposing flats 114F of groove 114 are squarely abutting spring members 230 and tends to feel as if it is not resisted when the curved portions or cams 114C of groove 114 between adjacent flats are in contact with and displace spring members 230 outwardly. Spring members 230 and flats 114F of selector knob 110 cooperate to provide a detent wherein selector knob 110 tends to seek and remain in stable rotational positions with opposing flats 114F of groove 114 abutting spring members 230. Preferably, the detent provided by spring members 230 may be made stronger than the detent, if any, provided by rotary switch 120.

Alternatively, support member 200 could be described as having a generally rectangular and relatively larger central opening 240 and two generally rectangular and generally smaller side openings 242 disposed adjacent opposing edges of the central opening in the hollow cylindrical outer support body 210 of support member 200. Thus, central opening 240 and adjacent side openings 242 define, for example, two substantially parallel elongated longitudinal (or axial) members 230 that by virtue of their being flexible or springy, serve as spring members 230. Also preferably, spring members 230 may be larger in a direction parallel to the line 111, 211 than in a direction transverse thereto, e.g., in chordal plane 232. Elongated spring members 230 may be disposed in the longitudinal direction, as illustrated, or may be in a transverse or other direction.

When support member 200 is disposed within housing 20, the opening 24 in housing 20 and the opening 240 in support member 200 are generally aligned radially so that rotatable selector knob 110 may be disposed therethrough to engage actuator 122 of rotary electrical switch 120 on circuit board 252 and may be rotated about the radial line 111, 211 for rotatably actuating rotary electrical switch 120 for selecting a desired operating condition. In this position, spring members 230 and the cams 114C and flats 114F of groove 114 of selector knob 110 preferably are in physical contact to cooperate to provide a detent.

Selector knob 110 may be retained in position through opening 24 by spring members 230 being disposed in groove 114. Retention of selector knob 110 is aided by circular retention flange 113 which is of larger diameter than is any flat 114F or cam 114C of groove 114 so that flange 113 will contact spring members 230 to resist removal of selector knob 110 from opening 24 of housing 20.

Preferably, and optionally, knob portion 118 may include several radial grooves 118G that improve gripping by a user's finger. Also preferably, and optionally, knob portion 118 may include a projection 118P that provides a tactile feature to indicate the rotary position of knob 110 to a user by sense of touch, and also provide a gripping feature.

In addition, knob portion 118 preferably has a generally flat central region 119 at which may be provided visual indications or symbols representative of the operating condition of light 10 corresponding to the visual indications or symbols. For example, an ON condition may be represented by a symbol comprising a circle of a color corresponding to the color or wavelength of light produced in that condition and/or of a diameter representative of the intensity of the light produced at that condition, e.g., with a larger symbol representing a higher brightness and a smaller symbol representing a lower brightness.

Thus, a symbol for a relatively higher brightness condition of a red LED could be a relatively larger circle colored red, a symbol for a relatively lower brightness condition of a red LED could be a relatively smaller circle colored red, a symbol for an ON condition of a white LED could be a circle colored white, and a symbol for an OFF condition could be a blank area or a black symbol, e.g., a black circle. Preferably and optionally, such symbols are provided on an adhesively-backed label 119L that is adhered to central region 119 of knob portion 118 of selector knob 110.

Also preferably and optionally, such adhesive label 119L may be over-laminated with a thin transparent plastic film to improve durability, and/or may include a luminous or phosphorescent film that appears to glow when the ambient light level diminishes, so as to be more easily seen in the dark or under low-light conditions, e.g., after being illuminated by light from an external source, such as sunlight, daylight or artificial light. Thus, the symbols, the region around the symbols, or both the symbols and the surrounding regions may phosphoresce or appear to "glow in the dark."

These features of selector knob 110 are thought to be beneficial in that a user of light 10 may select the desired function and may have visual and/or tactile confirmation of the selected operating mode or condition. In addition, the described arrangement may also offer relative ease of assembly, e.g., support member 200 may be slipped into housing 20 and selector knob 110 may be slipped through side hole 24 of housing 20 along line 111, 121 into position to engage switch 120 therein, and may be retained therein by spring members 230.

Selector knob 110 also may include an optional circumferential groove 116 into which an O-ring 26 may be placed for sealing an opening 24 in housing 20 into which or through which selector knob 110 of selector knob 110 extends.

Support member 200 is preferably a unitary molded plastic part, e.g., of a plastic having substantial rigidity for outer support 210, but also allowing suitable flexibility for flexing of spring members 230. Examples of suitable materials include acetals or polyoxymethylenes (e.g., POM, Delrin® plastic), nylon, polycarbonate and the like. Selector knob 110 is preferably a molded plastic part and examples of suitable materials include acetals or polyoxymethylenes (e.g., POM, Delrin® plastic), nylon, polycarbonate and the like. Circuit board 250 may be of any suitable material, e.g., fiberglass epoxy and FR4, and suitable rotary electrical switches include rotary DIP switches available from APEM Components, Inc., located in Haverhill, Mass.

Figure 5:
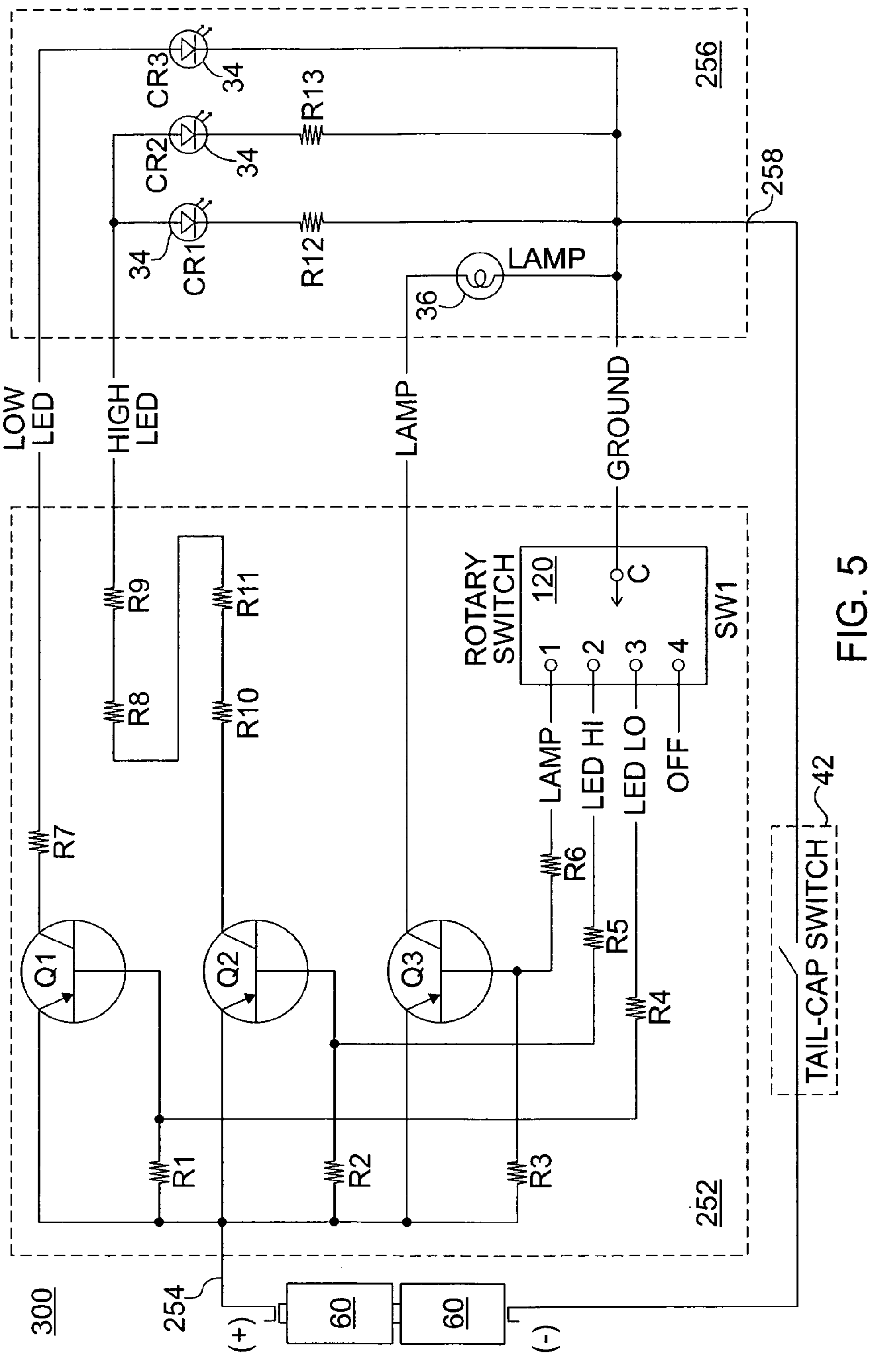
FIG. 5 is an electrical circuit schematic diagram of an example embodiment of a flashlight including a selector arrangement.

FIG. 5 is an electrical circuit schematic diagram of an example embodiment of a flashlight 10 including a selector arrangement 100. Specifically, the schematic diagram is of a circuit 300 for an example flashlight 10 having four selectable states (1)-(4) including three operating states (1)-(3) and an OFF state (4) as described above, and having a light source 30 comprising one lamp 36 and three LEDs 34. The four selectable states (1)-(4) including three operating states (1)-(3) and an OFF state (4) are represented by the numerals 1-4 identifying the respective poles of selector switch SW1, which may or may not correspond to the pin numbers of an actual switch 120, SW1.

In circuit 300, circuit board 252 includes transistors Q1-Q3 and their associated resistors R1-R11 that cooperate with switch 120, SW1 for selectively energizing lamp 36 and LEDs 34. Lamp 36 and LEDs 34 are located on circuit board 256 with resistors R12-R13. The positive terminal of battery 60, e.g., including two three-volt Lithium (Li) cells 60, connects via contact 254 to circuit board 252 and the negative terminal of battery 60 connects via tail cap switch 42, housing 20 and contact 258 to circuit board 256. Operation of circuit 300 is controlled by rotary selector switch 120, SW1 and by tail cap switch 42 which is in series with battery 60 for applying and removing battery 60 voltage from circuit 300.

When rotary switch 120, SW1 is rotated to position 1, the control terminal (base) of transistor Q3 is connected via resistor R6 to ground (battery negative when tail cap switch 42 is closed) to receive drive current, thereby rendering the controllable conduction path (collector-emitter path) of transistor Q3 conductive to apply positive battery voltage to energize lamp 36. This corresponds to the lamp 36 only operating state (1) described above.

When rotary switch 120, SW1 is rotated to position 2, the control terminal (base) of transistor Q2 is connected via resistor R5 to ground (battery negative when tail cap switch 42 is closed) to receive drive current, thereby rendering the controllable conduction path (collector-emitter path) of transistor Q2 conductive to apply positive battery voltage via series-connected resistors R8-R11 to energize two of LEDs 34, e.g., LEDs CR1, CR2. Each of LEDs CR1, CR2 has a resistor R12, R13, respectively, in series therewith, which tends to make the division of current between LEDs CR1 and CR2 more even. Resistors R8-R11, R12 and R13 cooperate to establish a desired level of current in LEDs, CR1, CR2, and are of relatively low ohmic value to establish a relatively high level of current in LEDs CR1, CR2. This corresponds to the high LED brightness operating state (2) described above. Plural resistors R8-R11 may be utilized to spread the heat generated by the power dissipated therein among several physical resistive components.

When rotary switch 120, SW1 is rotated to position 3, the control terminal (base) of transistor Q1 is connected via resistor R4 to ground (battery negative when tail cap switch 42 is closed) to receive drive current, thereby rendering the controllable conduction path (collector-emitter path) of transistor Q1 conductive to apply positive battery voltage to energize LED CR3 via resistor R7, which is of relatively high ohmic value to establish a relatively low level of current in LED CR3. This corresponds to the low LED brightness operating state (3) described above.

When rotary switch 120, SW1 is rotated to position 4, an open position, none of transistors Q1-Q3 receive drive current and so transistors Q1-Q3 are non-conductive irrespective of the position of tail cap switch 42, thereby rendering tail cap switch incapable of energizing any of lamp 36 and LEDs 34, CR1-CR3. This corresponds to the OFF operating state (4) described above, and provides a desirable feature in that accidental or unintentional actuation of pushbutton switch 42 does not result in light 10 producing illumination, e.g., at an undesirable time or place.

It is noted that transistors Q1-Q3 and their associated resistors R1-R6 provide energizing voltage and current for lamp 36 and for LEDs 34, CR1-CR3 via resistors R7-R11, so that switch 120, SW1 may conduct a relatively lower value of current than that required to energize lamp 36 and LEDs 34, CR1-CR3. As a result, the contacts of switch 120, SW1 may have a lower current-carrying rating. Resistors R1-R3 cooperate with resistors R4-R6 in energizing and de-energizing transistors Q1-Q3, respectively, responsive to the selected position of switch 120, SW1. Resistors R1-R6 and transistors Q1-Q3 can be eliminated if the contacts of switch 120, SW1 are rated to carry the currents of lamp 36 and LEDs 34.

Tail cap switch 42 may be utilized as the ON/OFF switch with rotary switch 120 employed as an operating mode selection switch, and the user may pre-select the desired operating mode by rotating switch 120 to the appropriate position and then controlling light 10 to be momentarily ON, continuously ON, or OFF, using tail cap switch 42. Alternatively, tail cap switch 42 may be set to the ON condition and rotary switch 120 may be employed as an operating mode selection switch and as the ON/OFF switch, as the user may find desirable. In addition, the capability to set both tail cap switch 42 and rotary switch 120 to respective OFF positions can be employed to reduce the likelihood that light 10 produce light at an undesired time, as might be important in security, military and police operations, or simply to avoid battery discharge when light 10 is stored, e.g., packed in luggage or elsewhere.

A selector arrangement 100 may comprise a flashlight housing 20 including a light source 30 and having a cavity for receiving a battery 60, a rotary electrical switch 120 having plural selection positions corresponding to different rotational positions, and a support member 200 in the cavity of flashlight housing 20. Support member 200 includes a spring member 230 and supports rotary electrical switch 120. A selector knob 110 rotatably engages spring member 230 and rotary electrical switch 120. Selector knob 110 includes a knob portion 118 that extends into and/or through an opening 24 in flashlight housing 20 for being rotatable from outside flashlight housing 20. Selector knob 110 has a projection 114 or has a groove 114 or has a projection and a groove 114 for engaging spring member 230 of support member 200 and engages rotary electrical switch 120 for selecting the plural selection positions thereof. Electrical conductors connect light source 30 and rotary electrical switch 120 in circuit for selectively energizing light source 30 responsive to rotation of rotary electrical switch 120. Selector knob 110 may have a number of circumferential flats 114F relating to the number of the plural selection positions of rotary electrical switch 120, wherein circumferential flats 114F may engage spring member 230 of support member 200 for providing a detent at each of the plural selection positions of rotary electrical switch 120. Rotary electrical switch 120 may have a number of detents corresponding to the number of the plural selection positions of rotary electrical switch 120, and the detents provided by the circumferential flats 114F of rotatable selector knob 110 engaging spring member 230 may be stronger than the detents of rotary electrical switch 120. Support member 200 may comprise a hollow cylindrical support body 210 having two opposing longitudinal grooves 220 therein for supporting rotary electrical switch 120. Support member 200 may comprise a hollow cylindrical support body 210 having at least two closely spaced openings 240, 242 in tire wall thereof, and openings 240, 242 may define therebetween at least one elongated spring member 230 comprising spring member 230. Support member 200 may comprise a hollow cylindrical support body 210 having three closely spaced openings 242, 240, 242 in the wall thereof, the openings 242, 240, 242 including a central opening 240 and two side openings 242 respectively adjacent to opposite sides of the central opening 240 for defining therebetween two substantially parallel elongated spring members 230 comprising spring member 230. Selector knob 10 may extend radially through the central opening 240 of support member 200 for engaging rotary electrical switch 120. The knob portion 118 of rotatable selector knob 110 that extends outside of flashlight housing 20 may have symbols thereon representative of operating conditions corresponding to the plural selection positions of rotary electrical switch 120, or may have radial grooves 118G or may have a projection 118P or may have both radial grooves 118G and projection 118P, or may have symbols thereon representative of operating conditions corresponding to the plural selection positions of rotary electrical switch 120 and may have radial grooves 118G and/or a projection 118P. The symbols representative of operating conditions may phosphoresce or a region surrounding the symbols may phosphoresce or both the symbols and the region surrounding the symbols may phosphoresce. The plural selection positions of rotary electrical switch 120 may select different brightness levels of light source 30, or may select different colors of light source 30, or may select different wavelengths of light source 30, or may select different kinds of light source 30, or may select a different number of light producing elements of light source 30, or may select an OFF condition of light source 30, or may select any combination of any of the foregoing. An electrical ON/OFF switch 42 may be connected in series with rotary electrical switch 120. Rotary electrical switch 120 may have an OFF selection position, or electrical ON/OFF switch 42 may have continuous ON, momentary ON, and OFF positions, or rotary electrical switch 120 may have an OFF selection position and electrical ON/OFF switch 42 may have continuous ON, momentary ON, and OFF positions.

A selector arrangement 100 may comprise a flashlight 10 including first and second light sources 30, 34, 36, having a cavity for receiving at least a battery 60, and having an opening 24 in a wall 20 thereof. A support member 200 in the cavity of flashlight 10 includes a spring member 230 adjacent an opening 240 therein, wherein the opening 240 of support member 200 generally aligns with the opening 24 of the wall 20 of flashlight 10. A rotary electrical switch 120 having plural selection positions corresponding to different rotational positions is supported by support member 200 for being actuatable through the aligned openings 24, 240 of flashlight 10 and support member 200. A selector knob 110 is rotatably disposed in the aligned openings 24, 240 of flashlight 10 and support member 200 for engaging spring member 230 and engaging rotary electrical switch 120 for rotatably actuating rotary electrical switch 120 for selecting among the plural selection positions thereof, wherein selector knob 110 is rotatable from outside flashlight 10. Selector knob 110 has a projection 114 or has a groove 114 or has a projection and a groove 114 engaging spring member 230 of support member 200. Electrical conductors connect first and second light sources 30, 34, 36 and rotary electrical switch 120 in circuit for selectively energizing first light source 30, 34 or second light source 30, 36 or both first and second light sources 30, 34, 36 responsive to rotation of rotary electrical switch 120. Selector knob 110 may have a number of circumferential flats 114F relating to the number of the plural selection positions of rotary electrical switch 120, and circumferential flats 114F may engage spring member 230 of support member 200 for providing a detent at each of the plural selection positions of rotary electrical switch 120. Rotary electrical switch 120 may have a number of detents corresponding to the number of the plural selection positions of rotary electrical switch 120, and the detents provided by the circumferential flats 114F of rotatable selector knob 110 engaging spring member 230 may be stronger than the detents of rotary electrical switch 120. Support member 200 may comprise a hollow cylindrical support body 210 having two opposing longitudinal grooves 220 therein for supporting rotary electrical switch 120. Support member 200 may comprise a hollow cylindrical support body 210 having at least two closely spaced openings 240, 242 in the wall thereof, the openings 240, 242 defining therebetween at least one elongated spring member 230 comprising spring member 230. Support member 200 may comprise a hollow cylindrical support body 210 having three closely spaced openings 242, 240, 242 in the wall thereof, the openings 242, 240, 242 including a central opening 240 and two side openings 242 respectively adjacent to opposite sides of the central opening 240 for defining therebetween two substantially parallel elongated spring members 230 comprising spring member 230. Selector knob 110 may extend radially through the central opening 240 of support member 200 for engaging rotary electrical switch 120. The knob portion 118 of rotatable selector knob 110 that extends outside of flashlight 10 may have symbols thereon representative of operating conditions corresponding to the plural selection positions of rotary electrical switch 120, or may have radial grooves 118G or a projection 118P or both radial grooves 118G and a projection 118P, or may have symbols thereon representative of operating conditions corresponding to the plural selection positions of rotary electrical switch 120 and radial grooves 118G and/or a projection 118P. At least the symbols representative of operating conditions may phosphoresce or a region surrounding the symbols may phosphoresce or both the symbols and the region surrounding the symbols may phosphoresce. The plural selection positions of rotary electrical switch 120 may select different brightness levels of first light source 30, 34, or different brightness levels of second light source 30, 36, or different colors of first and second light sources 30, 34, 36, or different wavelengths of first and second light sources 30, 34, 36, or different kinds of first and second light sources 30, 34, 36, or an OFF condition of first light source 30, 34 or of second light source 30, 36 or of both, or any combination of any of the foregoing. Flashlight 10 may include an electrical ON/OFF switch 42 connected in series with rotary electrical switch 120. Rotary electrical switch 120 may have an OFF selection position, or electrical ON/OFF switch 42 may have continuous ON, momentary ON, and OFF positions, or rotary electrical switch 120 may have an OFF selection position and electrical ON/OFF switch 42 may have continuous ON, momentary ON, and OFF positions.

A selector arrangement 100 may comprise a hollow support member 200 including a spring member 230 adjacent a first opening 240 therein, and a rotary electrical switch 120 having plural selection positions corresponding to different rotational positions, wherein rotary electrical switch 120 is supported interior hollow support member 200 for being rotatably actuatable about a radial 111, 211 extending through first opening 240 of hollow support member 200. A selector knob 110 is rotatably disposed in the first opening 240 of hollow support member 200 for engaging spring member 230 for providing a detent and for engaging rotary electrical switch 120 for rotatably actuating rotary electrical switch 120 for selecting among the plural selection positions thereof, wherein selector knob 110 is rotatable about the radial 111, 211 from outside hollow support member 200. Selector knob 110 has a projection 114 or has a groove 114 or has a projection and a groove 114 engaging spring member 230 of hollow support member 200 for retaining selector knob 10 and for providing a rotational detent. Rotary electrical switch 120 may provide a detent at its selection positions and selector knob 110 engaging spring member 230 may provide a detent corresponding to the detent of rotary electrical switch 120 at its selection positions. Hollow support member 200 may have at least a second opening 242 therein adjacent the first opening 240 in which selector knob 110 is disposed, and first and second openings 240, 242 may define spring member 230 therebetween. Rotary electrical switch 120 may be supported on a circuit board 250 disposed in hollow support member 200. Hollow support member 200 may have a pair of inward facing recesses 220 in an interior surface thereof for supporting circuit board 250. Selector knob 110 may include a knob portion 118 that extends exterior support member 200, and knob portion 118 may have symbols thereon representative of operating conditions corresponding to the plural selection positions of rotary electrical switch 120, or may have radial grooves 118G or may have a projection 118P or may have both radial grooves 118G and a projection 118P, or may have symbols thereon representative of operating conditions corresponding to the plural selection positions of rotary electrical switch 120 and may have radial grooves 118G and/or a projection 118P. The symbols representative of operating conditions may phosphoresce or a region surrounding the symbols may phosphoresce or both the symbols and the region surrounding the symbols may phosphoresce. The projection or groove or projection and groove 114 of selector knob 110 may include a plurality of flats 114F and cams 114C alternatingly arranged around a periphery of selector knob 110. An electrical ON/OFF switch 42 may be connected in series with rotary electrical switch 120. Rotary electrical switch 120 may have an OFF selection position, or electrical ON/OFF switch 42 may have continuous ON, momentary ON, and OFF positions, or rotary electrical switch 120 may have an OFF selection position and electrical ON/OFF switch 42 may have continuous ON, momentary ON, and OFF positions.

A selector arrangement 100 may comprise a hollow support member 200 including a spring member 230 adjacent a first opening 240 therein, and a rotary electrical switch 120 having plural detented selection positions corresponding to different rotational positions, wherein rotary electrical switch 120 is supported interior hollow support member 200 for being rotatably actuatable about a radial 111, 211 extending through the first opening 240 of hollow support member 200. A selector knob 110 is rotatably disposed in the first opening 240 of hollow support member 200 for engaging spring member 230 for providing a detent corresponding to the detent of rotary electrical switch 120 and for engaging rotary electrical switch 120 for rotatably actuating rotary electrical switch 120 for selecting among the plural selection positions thereof, wherein selector knob 110 is rotatable about the radial 111, 211 from outside hollow support member 200. Selector knob 110 may have a projection 114 or may have a groove 114 or may have a projection and a groove 114 engaging spring member 230 for retaining selector knob 110 in hollow support member 200 and for providing the rotational detent. Projection 114 or groove 114 or projection and groove 114 of selector knob 110 may include a plurality of flats 114F and cams 114C alternatingly arranged around a periphery of selector knob 110. Hollow support member 200 may have at least a second opening 242 therein adjacent the first opening 240 in which selector knob 110 is disposed, and the first and second openings 240, 242 may define spring member 230 therebetween. Rotary electrical switch 120 may be supported on a circuit board 250 disposed in hollow support member 200. Hollow support member 200 may have a pair of inward facing recesses 220 in an interior surface thereof for supporting circuit board 250. Selector knob 110 may include a knob portion that 118 extends exterior support member 200, wherein knob portion 118 may have symbols thereon representative of operating conditions corresponding to the plural selection positions of rotary electrical switch 120, or may have radial grooves 118G or may have a projection 118P or may have both radial grooves 118G and a projection 118P, or may have symbols thereon representative of operating conditions corresponding to the plural selection positions of rotary electrical switch 120 and may have radial grooves 118G and/or a projection 118P. The symbols representative of operating conditions may phosphoresce or a region surrounding the symbols may phosphoresce or both the symbols and the region surrounding the symbols may phosphoresce. An electrical ON/OFF switch 42 may be connected in series with rotary electrical switch 120. Rotary electrical switch 120 may have an OFF selection position, or electrical ON/OFF switch 42 may have continuous ON, momentary ON, and OFF positions, or rotary electrical switch 120 may have an OFF selection position and electrical ON/OFF switch 42 may have continuous ON, momentary ON, and OFF positions.

A selector arrangement 100 may comprise a flashlight 10 including an incandescent light source 36 and a solid state light source 34, having a cylindrical cavity for receiving one or more batteries 60, and having an electrical ON/OFF switch 42. The flashlight 10 has an opening 24 in a wall 20 thereof and a cylindrical support member 200 in the cylindrical cavity of the flashlight 10. Support member 200 includes a pair of opposing spring members 230 adjacent an opening 240 therein, and opening 240 of support member 200 generally aligns with opening 24 of flashlight 10 wall. An electrical circuit board 250 is supported by cylindrical support member 200 and faces opening 240 of support member 200. A rotary electrical switch 120 has plural selection positions corresponding to different rotational positions, and rotary electrical switch 120 is supported by electrical circuit board 250 for being actuatable through aligned openings 24, 240 of flashlight 10 and support member 200. A selector knob 110 is rotatably disposed in the aligned openings 24, 240 of flashlight 10 and cylindrical support member 200 for engaging rotary electrical switch 120 for rotatably actuating rotary electrical switch 120 for selecting among the plural selection positions thereof, wherein selector knob 110 is rotatable from outside flashlight 10. Selector knob 110 has a plurality of pairs of opposing flat surfaces 114 around the periphery thereof, and each pair of opposing flat surfaces 114 engages the pair of opposing spring members 230 at a different rotational position of rotary electrical switch 120 for providing a detent. Selector knob 110 has a projection 113 or has a groove 113 or has a projection and a groove 113 engaging the pair of opposing spring members 230 of support member 200 for retaining selector knob 110 in a predetermined location relative to cylindrical support member 200. Electrical conductors connect incandescent light source 36, solid state light source 34, rotary electrical switch 120 and electrical ON/OFF switch 42 in circuit for selectively energizing incandescent light source 36 or solid state light source 42 or both incandescent light source 36 and solid state light source 34 responsive to rotation of rotary electrical switch 120, when a battery 60 is in the cylindrical cavity of flashlight 10. Solid state light source 34 may include a plurality of LEDs 34, and the plural selection positions of rotary electrical switch 120 may include an ON condition for incandescent light source 36, an ON condition for one of the plurality of LEDs 34, an ON condition for more than one of the plurality of LEDs 34, and an OFF condition. The electrical conductors may connect rotary electrical switch 120 and electrical ON/OFF switch 42 in series, and each of rotary electrical switch 120 and electrical ON/OFF switch 42 may have an OFF position. Incandescent light source 36 may include a halogen lamp, a xenon lamp, a tungsten lamp, or a combination thereof. Solid state light source 34 may include one or more LEDs, one or more lasers, one or more laser diodes, one or more infrared sources, one or more ultraviolet sources, one or more high power LEDs, one or more low power LEDs, or a combination thereof. Incandescent light source 36 may include a halogen lamp, a xenon lamp, a tungsten lamp or a combination thereof, and solid state light source 34 may include one or more LEDs, one or more lasers, one or more laser diodes, one or more infrared sources, one or more ultraviolet sources, one or more high power LEDs, one or more low power LEDs or a combination thereof.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. It is noted that embodiments of very different sizes and dimensions may employ the described arrangements. It is noted that embodiments of very different sizes, shapes and dimensions may employ the described arrangements.

While the present invention has been described in terms of the foregoing example embodiments, variations within the scope and spirit of the present invention as defined by the claims following will be apparent to those skilled in the art. For example, the example selector switch arrangement 100 described herein may be employed for selecting a particular light source from among plural light sources of the same or of different kinds, for selecting the intensity and/or brightness level of a light source, for selecting from among light sources of different colors, or for selecting from among light sources of different wavelengths, or for any combination of any one or more of the foregoing.

By way of example, the selector arrangement may select from among two brightness levels of one light source of a first color or wavelength and a second light source of a different color or wavelength. By way of example, the selector arrangement may select from among light sources of different kinds, such as from among solid state light sources, such as LED and/or laser light sources, infrared light sources, ultraviolet light sources, and incandescent light sources, such as incandescent lamps, xenon lamps, halogen lamps, and the like. Also, the selector arrangement may select one or more of plural light producing elements of a light source, e.g., for selecting brightness, color, wavelength, or other characteristic thereof.

In any of the example selector arrangements, one of the selector selections may be an OFF condition wherein no light source is energized. Alternatively and/or additionally, but optionally, a flashlight may include an ON/OFF switch that is separate from the selector switch, which ON/OFF switch may be a pushbutton actuated switch, a rotary actuated switch, a clicker-type switch, a slide switch, or any other suitable switch, and may be located at any suitable desired location on light 10.

While groove 114 of selector knob 110 may have a number of flats 114F and cams 114C alternatingly arranged in a groove 114 around a circumference of selector knob 110, flats 114F and cams 114C may be alternatingly arranged on a raised portion of selector knob 110. In either case, the raised cams 114C may be provided at the edge line defined by the intersection of adjacent flats.

While two substantially parallel spring members 230 are described, one spring member or more than two spring members could be employed. In addition, while spring members 230 are described as being molded, preferably as part of support member 200, spring members 230 could be separate from support member 200 and could be attached or mounted thereto, e.g., metal leaf springs that are inserted into cavities provided in support member 200 to receive spring members 230.

Further, while spring members 230 of support member 200 are described as being longitudinal or axial, they may be transverse to the illustrated axial direction, e.g., they could be in a circumferential direction or in another direction, so that spring members 230 and the detent groove 114 of selector knob 110 may cooperate with each other to provide for retention of selector knob 110, or to provide a detent, or both.

The described selector arrangement 100 may be utilized in portable electrical devices other than a flashlight. Examples could include electric toothbrushes, electric shavers, electric tools, gun-mounted or tool-mounted lights and/or devices, and the like. Therein, various operating conditions may be selected, such as heat level, operating speed, direction, and the like.

While the different kinds of light sources generally refers to, for example, incandescent and solid state light sources, light sources also encompass different incandescent light sources such as halogen, xenon, tungsten and the like, as well as different solid state light sources such as LEDs, lasers, laser diodes, infrared sources, ultraviolet sources, high and low power LEDs and the like. Further, plural light sources may be selectably energizable in various combinations so as to produce light of any desired color, wavelength, brightness, or other characteristic.

Suitable batteries may include single or plural batteries, each including a single cell or plural cells. Plural cells and/or plural batteries may be in a common package or other container, if desired or convenient.

Finally, numerical values stated are typical or example values, are not limiting values, and do not preclude substantially larger and substantially smaller values.

What is claimed is:

1. A selector arrangement comprising:

a flashlight housing including a light source and having a cavity for receiving a battery;

a rotary electrical switch having plural selection positions corresponding to different rotational positions;

a support member in the cavity of said flashlight housing, said support member including a spring member and supporting said rotary electrical switch;

a selector knob rotatably engaging said spring member and said rotary electrical switch, wherein said selector knob includes a knob portion that extends into an opening in said flashlight housing or extends through the opening in said flashlight housing or extends into and through the opening in said flashlight housing for being rotatable from outside said flashlight housing, wherein said selector knob has a projection or has a groove or has a projection and a groove engaging said spring member of said support member, wherein said selector knob engages said rotary electrical switch for selecting the plural selection positions thereof; and electrical conductors for connecting said light source and said rotary electrical switch in circuit for selectively energizing said light source responsive to rotation of said rotary electrical switch, whereby said light source is selectively energizable among a plurality of conditions responsive to rotation of said selector knob when a battery is in the cavity of said flashlight housing.

2. The selector arrangement of claim 1 wherein said selector knob has a number of circumferential flats relating to the number of the plural selection positions of said rotary electrical switch, wherein said circumferential flats engage said spring member of said support member for providing a detent at each of the plural selection positions of said rotary electrical switch.

3. The selector arrangement of claim 2 wherein said rotary electrical switch has a number of detents corresponding to the number of the plural selection positions of said rotary electrical switch, wherein the detents provided by the circumferential flats of said rotatable selector knob engaging said spring member are stronger than the detents of said rotary electrical switch.

4. The selector arrangement of claim 1 wherein said support member comprises a hollow cylindrical support body having two opposing longitudinal grooves therein for supporting said rotary electrical switch.

5. The selector arrangement of claim 1 wherein said support member comprises a hollow cylindrical support body having at least two closely spaced openings in the wall thereof, the openings for defining therebetween at least one elongated spring member comprising said spring member.

6. The selector arrangement of claim 1 wherein said support member comprises a hollow cylindrical support body having three closely spaced openings in the wall thereof, the openings including a central opening and two side openings respectively adjacent to opposite sides of the central opening for defining therebetween two substantially parallel elongated spring members comprising said spring member.

7. The selector arrangement of claim 6 wherein said selector knob extends radially through the central opening of said support member for engaging said rotary electrical switch.

8. The selector arrangement of claim 1 wherein the knob portion of said rotatable selector knob that extends outside of said flashlight housing:

has symbols thereon representative of operating conditions corresponding to the plural selection positions of said rotary electrical switch; or has radial grooves or has a projection or has both radial grooves and a projection; or has symbols thereon representative of operating conditions corresponding to the plural selection positions of said rotary electrical switch and has radial grooves or has a projection or has both radial grooves and a projection.

9. The selector arrangement of claim 8 wherein at least the symbols representative of operating conditions phosphoresce or a region surrounding the symbols phosphoresces or both the symbols and the region surrounding the symbols phosphoresce.

10. The selector arrangement of claim 1 wherein the plural selection positions of said rotary electrical switch select different brightness levels of said light source, or different colors of said light source, or different wavelengths of said light source, or different kinds of said light source, or a different number of light producing elements of said light source, or an OFF condition of said light source, or any combination of any of the foregoing.

11. The selector arrangement of claim 1 further comprising an electrical ON/OFF switch connected in series with said rotary electrical switch.

12. The selector arrangement of claim 11 wherein:

said rotary electrical switch has an OFF selection position; or said electrical ON/OFF switch has continuous ON, momentary ON, and OFF positions; or said rotary electrical switch has an OFF selection position and said electrical ON/OFF switch has continuous ON, momentary ON, and OFF positions.

13. A selector arrangement comprising:

a flashlight housing including a light source and having a cavity for receiving a battery;

a rotary electrical switch in the cavity of said flashlight housing and having plural selection positions corresponding to different rotational positions;

a spring member adjacent an opening in said flashlight housing;

a selector knob rotatably engaging said spring member and said rotary electrical switch, wherein said selector knob includes a knob portion that extends into the opening in said flashlight housing or extends through the opening in said flashlight housing or extends into and through the opening in said flashlight housing for being rotatable from outside said flashlight housing, wherein said selector knob has a projection or has a groove or has a projection and a groove engaging said spring member;

wherein said selector knob engages said rotary electrical switch for selecting the plural selection positions thereof; and electrical conductors for connecting said light source and said rotary electrical switch in circuit for selectively energizing said light source responsive to rotation of said rotary electrical switch, whereby said light source is selectively energizable among a plurality of conditions responsive to rotation of said selector knob when a battery is in the cavity of said flashlight housing.

14. The selector arrangement of claim 13 wherein said selector knob has a number of circumferential flats relating to the number of the plural selection positions of said rotary electrical switch, wherein said circumferential flats engage said spring member for providing a detent at each of the plural selection positions of said rotary electrical switch.

15. The selector arrangement of claim 14 wherein said rotary electrical switch has a number of detents corresponding to the number of the plural selection positions of said rotary electrical switch, wherein the detents provided by the circumferential flats of said rotatable selector knob engaging said spring member are stronger than the detents of said rotary electrical switch.

16. The selector arrangement of claim 13 further comprising a support member for supporting said rotary electrical switch.

17. The selector arrangement of claim 13 wherein the knob portion of said rotatable selector knob that extends outside of said flashlight housing:

has symbols thereon representative of operating conditions corresponding to the plural selection positions of said rotary electrical switch; or has radial grooves or has a projection or has both radial grooves and a projection; or has symbols thereon representative of operating conditions corresponding to the plural selection positions of said rotary electrical switch and has radial grooves or has a projection or has both radial grooves and a projection.

18. The selector arrangement of claim 17 wherein at least the symbols representative of operating conditions phosphoresce or a region surrounding the symbols phosphoresces or both the symbols and the region surrounding the symbols phosphoresce.

19. The selector arrangement of claim 13 wherein the plural selection positions of said rotary electrical switch select different brightness levels of said light source, or different colors of said light source, or different wavelengths of said light source, or different kinds of said light source, or a different number of light producing elements of said light source, or an OFF condition of said light source, or any combination of any of the foregoing.

20. The selector arrangement of claim 13 further comprising an electrical ON/OFF switch connected in series with said rotary electrical switch.

21. The selector arrangement of claim 20 wherein:

said rotary electrical switch has an OFF selection position; or said electrical ON/OFF switch has continuous ON, momentary ON, and OFF positions; or said rotary electrical switch has an OFF selection position and said electrical ON/OFF switch has continuous ON, momentary ON, and OFF positions.

22. A selector arrangement comprising:

a flashlight including first and second light sources and having a cavity for receiving at least a battery, said flashlight having an opening in a wall thereof;

a support member in the cavity of said flashlight, said support member including a spring member adjacent an opening therein, wherein the opening of said support member generally aligns with the opening of said flashlight wall;

a rotary electrical switch having plural selection positions corresponding to different rotational positions, wherein said rotary electrical switch is supported by said support member for being actuatable through the aligned openings of said flashlight and said support member;

a selector knob rotatably disposed in the aligned openings of said flashlight and said support member for engaging said spring member and engaging said rotary electrical switch for rotatably actuating said rotary electrical switch for selecting among the plural selection positions thereof, wherein said selector knob is rotatable from outside said flashlight, wherein said selector knob has a projection or has a groove or has a projection and a groove engaging said spring member of said support member; and electrical conductors for connecting said first and second light sources and said rotary electrical switch in circuit for selectively energizing said first light source or said second light source or both said first and second light sources responsive to rotation of said rotary electrical switch, whereby said first and second light sources are selectively energizable among a plurality of conditions responsive to rotation of said selector knob when a battery is in the cavity of said flashlight.

23. The selector arrangement of claim 22 wherein said selector knob has a number of circumferential flats relating to the number of the plural selection positions of said rotary electrical switch, wherein said circumferential flats engage said spring member of said support member for providing a detent at each of the plural selection positions of said rotary electrical switch.

24. The selector arrangement of claim 23 wherein said rotary electrical switch has a number of detents corresponding to the number of the plural selection positions of said rotary electrical switch, wherein the detents provided by the circumferential flats of said rotatable selector knob engaging said spring member are stronger than the detents of said rotary electrical switch.

25. The selector arrangement of claim 22 wherein said support member comprises a hollow cylindrical support body having two opposing longitudinal grooves therein for supporting said rotary electrical switch.

26. The selector arrangement of claim 22 wherein said support member comprises a hollow cylindrical support body having at least two closely spaced openings in the wall thereof, the openings for defining therebetween at least one elongated spring member comprising said spring member.

27. The selector arrangement of claim 22 wherein said support member comprises a hollow cylindrical support body having three closely spaced openings in the wall thereof, the openings including a central opening and two side openings respectively adjacent to opposite sides of the central opening for defining therebetween two substantially parallel elongated spring members comprising said spring member.

28. The selector arrangement of claim 27 wherein said selector knob extends radially through the central opening of said support member for engaging said rotary electrical switch.

29. The selector arrangement of claim 22 wherein the knob portion of said rotatable selector knob that extends outside of said flashlight:

has symbols thereon representative of operating conditions corresponding to the plural selection positions of said rotary electrical switch; or has radial grooves or has a projection or has both radial grooves and a projection; or has symbols thereon representative of operating conditions corresponding to the plural selection positions of said rotary electrical switch and has radial grooves or has a projection or has both radial grooves and a projection.

30. The selector arrangement of claim 29 wherein at least the symbols representative of operating conditions phosphoresce or a region surrounding the symbols phosphoresces or both the symbols and the region surrounding the symbols phosphoresce.

31. The selector arrangement of claim 22 wherein the plural selection positions of said rotary electrical switch select different brightness levels of said first light source, or different brightness levels of said second light source, or different colors of said first and second light sources, or different wavelengths of said first and second light sources, or different kinds of said first and second light sources, or an OFF condition of said first light source or of said second light source or of both, or any combination of any of the foregoing.

32. The selector arrangement of claim 22 wherein said flashlight further includes an electrical ON/OFF switch connected in series with said rotary electrical switch.

33. The selector arrangement of claim 32 wherein:

said rotary electrical switch has an OFF selection position; or said electrical ON/OFF switch has continuous ON, momentary ON, and OFF positions; or said rotary electrical switch has an OFF selection position and said electrical ON/OFF switch has continuous ON, momentary ON, and OFF positions.

34. A selector arrangement comprising:

a hollow support member including a spring member adjacent a first opening therein;

a rotary electrical switch having plural selection positions corresponding to different rotational positions, wherein said rotary electrical switch is supported interior said hollow support member for being rotatably actuatable about a radial extending through the first opening of said hollow support member;

a selector knob rotatably disposed in the first opening of said hollow support member for engaging said spring member for providing a detent and for engaging said rotary electrical switch for rotatably actuating said rotary electrical switch for selecting among the plural selection positions thereof, wherein said selector knob is rotatable about the radial from outside said hollow support member, wherein said selector knob has a projection or has a groove or has a projection and a groove engaging said spring member of said hollow support member for retaining said selector knob and for providing a rotational detent, whereby said rotary electrical switch is selectively rotatable and is detented responsive to rotation of said selector knob.

35. The selector arrangement of claim 34 wherein said rotary electrical switch provides a detent at its selection positions and wherein said selector knob engaging said spring member provides a detent corresponding to the detent of said rotary electrical switch at its selection positions.

36. The selector arrangement of claim 34 wherein said hollow support member has at least a second opening therein adjacent the first opening in which said selector knob is disposed, said first and second openings defining said spring member therebetween.

37. The selector arrangement of claim 34 wherein said rotary electrical switch is supported on a circuit board disposed in said hollow support member.

38. The selector arrangement of claim 37 wherein said hollow support member has a pair of inward facing recesses in an interior surface thereof for supporting said circuit board.

39. The selector arrangement of claim 34 wherein said selector knob includes a knob portion that extends exterior said support member, wherein said knob portion:

has symbols thereon representative of operating conditions corresponding to the plural selection positions of said rotary electrical switch; or has radial grooves or has a projection or has both radial grooves and a projection; or has symbols thereon representative of operating conditions corresponding to the plural selection positions of said rotary electrical switch and has radial grooves or has a projection or has both radial grooves and a projection.

40. The selector arrangement of claim 39 wherein at least the symbols representative of operating conditions phosphoresce or a region surrounding the symbols phosphoresces or both the symbols and the region surrounding the symbols phosphoresce.

41. The selector arrangement of claim 34 wherein the projection or groove or projection and groove of said selector knob includes a plurality of flats and cams alternatingly arranged around a periphery of said selector knob.

42. The selector arrangement of claim 34 further comprising an electrical ON/OFF switch connected in series with said rotary electrical switch.

43. The selector arrangement of claim 42 wherein:

said rotary electrical switch has an OFF selection position; or said electrical ON/OFF switch has continuous ON, momentary ON, and OFF positions; or said rotary electrical switch has an OFF selection position and said electrical ON/OFF switch has continuous ON, momentary ON, and OFF positions.

44. A selector arrangement comprising:

a hollow support member including a spring member adjacent a first opening therein;

a rotary electrical switch having plural detented selection positions corresponding to different rotational positions, wherein said rotary electrical switch is supported interior said hollow support member for being rotatably actuatable about a radial extending through the first opening of said hollow support member, and a selector knob rotatably disposed in the first opening of said hollow support member for engaging said spring member for providing a detent corresponding to the detent of said rotary electrical switch and for engaging said rotary electrical switch for rotatably actuating said rotary electrical switch for selecting among the plural selection positions thereof, wherein said selector knob is rotatable about the radial from outside said hollow support member, whereby said selector knob is detented by the plural detented selection positions of said rotary electrical switch and is correspondingly detented by said selector knob engaging said spring member.

45. The selector arrangement of claim 44 wherein said selector knob has a projection or has a groove or has a projection and a groove engaging said spring member for retaining said selector knob in said hollow support member and for providing the rotational detent.

46. The selector arrangement of claim 45 wherein the projection or groove or projection and groove of said selector knob includes a plurality of flats and cams alternatingly arranged around a periphery of said selector knob.

47. The selector arrangement of claim 44 wherein said hollow support member has at least a second opening therein adjacent the first opening in which said selector knob is disposed, said first and second openings defining said spring member therebetween.

48. The selector arrangement of claim 44 wherein said rotary electrical switch is supported on a circuit board disposed in said hollow support member.

49. The selector arrangement of claim 48 wherein said hollow support member has a pair of inward facing recesses in an interior surface thereof for supporting said circuit board.

50. The selector arrangement of claim 44 wherein said selector knob includes a knob portion that extends exterior said support member, wherein said knob portion:

has symbols thereon representative of operating conditions corresponding to the plural selection positions of said rotary electrical switch; or has radial grooves or has a projection or has both radial grooves and a projection; or has symbols thereon representative of operating conditions corresponding to the plural selection positions of said rotary electrical switch and has radial grooves or has a projection or has both radial grooves and a projection.

51. The selector arrangement of claim 50 wherein at least the symbols representative of operating conditions phosphoresce or a region surrounding the symbols phosphoresces or both the symbols and the region surrounding the symbols phosphoresce.

52. The selector arrangement of claim 44 further comprising an electrical ON/OFF switch connected in series with said rotary electrical switch.

53. The selector arrangement of claim 52 wherein:

said rotary electrical switch has an OFF selection position; or said electrical ON/OFF switch has continuous ON, momentary ON, and OFF positions; or said rotary electrical switch has an OFF selection position and said electrical ON/OFF switch has continuous ON, momentary ON, and OFF positions.

54. A selector arrangement comprising:

a flashlight including an incandescent light source and a solid state light source, and having a cylindrical cavity for receiving one or more batteries, and having an electrical ON/OFF switch, said flashlight having an opening in a wall thereof;

a cylindrical support member in the cylindrical cavity of said flashlight, said cylindrical support member including a pair of opposing spring members adjacent an opening therein, wherein the opening of said cylindrical support member generally aligns with the opening of said flashlight wall;

an electrical circuit board supported by said cylindrical support member facing the opening of said cylindrical support member, a rotary electrical switch having plural selection positions corresponding to different rotational positions, wherein said rotary electrical switch is supported by said electrical circuit board for being actuatable through the aligned openings of said flashlight and said cylindrical support member;

a selector knob rotatably disposed in the aligned openings of said flashlight and said cylindrical support member for engaging said rotary electrical switch for rotatably actuating said rotary electrical switch for selecting among the plural selection positions thereof, wherein said selector knob is rotatable from outside said flashlight, wherein said selector knob has a plurality of pairs of opposing flat surfaces around the periphery thereof, each pair of opposing flat surfaces engaging said pair of opposing spring members at a different rotational position of said rotary electrical switch for providing a detent, wherein said selector knob has a projection or has a groove or has a projection and a groove engaging said pair of opposing spring members of said cylindrical support member for retaining said selector knob in a predetermined location relative to said cylindrical support member, and electrical conductors for connecting said incandescent light source, said solid state light source, said rotary electrical switch and said electrical ON/OFF switch in circuit for selectively energizing said incandescent light source or said solid state light source or both said incandescent light source and solid state light source responsive to rotation of said rotary electrical switch when a battery is in the cylindrical cavity of said flashlight.

55. The selector arrangement of claim 54 wherein said solid state light source includes a plurality of LEDs, and wherein the plural selection positions of said rotary electrical switch include an ON condition for said incandescent light source, an ON condition for one of said plurality of LEDs, an ON condition for more than one of said plurality of LEDs, and an OFF condition.

56. The selector arrangement of claim 54 wherein said electrical conductors connect said rotary electrical switch and said electrical ON/OFF switch in series, and wherein each of said rotary electrical switch and said electrical ON/OFF switch have an OFF position.

57. The selector arrangement of claim 54 wherein:

said incandescent light source includes a halogen lamp, a xenon lamp, a tungsten lamp, or a combination thereof, or said solid state light source includes one or more LEDs, one or more lasers, one or more laser diodes, one or more infrared sources, one or more ultraviolet sources, one or more high power LEDs, one or more low power LEDs, or a combination thereof; or said incandescent light source includes a halogen lamp, a xenon lamp, a tungsten lamp or a combination thereof, and said solid state light source includes one or more LEDs, one or more lasers, one or more laser diodes, one or more infrared sources, one or more ultraviolet sources, one or more high power LEDs, one or more low power LEDs or a combination thereof.

* * * * *